United States Patent
Bennett et al.

[11] Patent Number: 5,872,460
[45] Date of Patent: Feb. 16, 1999

[54] FAST ACTING FET TEST CIRCUIT WITH CURRENT DETECTION FOR SIR DIAGNOSTICS

[75] Inventors: Paul T. Bennett, Phoenix, Ariz.; Richard Joseph Ravas; Robert Keith Constable, both of Kokomo, Ind.; Randall C. Gray, Tempe, Ariz.; Terrell Anderson, Carmel, Ind.

[73] Assignee: Delco Electronics Corp., Kokomo, Ind.

[21] Appl. No.: 726,897

[22] Filed: Oct. 4, 1996

[51] Int. Cl.$^6$ ............................ G01R 31/26; B60R 21/32
[52] U.S. Cl. ............................................ 324/769; 280/735
[58] Field of Search ............ 324/769; 280/728.1–743.2; 340/644, 653; 361/87, 93, 101; 307/10.1

[56] References Cited

U.S. PATENT DOCUMENTS

| | | | |
|---|---|---|---|
| 5,409,258 | 4/1995 | Kawabata | 280/735 |
| 5,621,326 | 4/1997 | Watanabe et al. | 324/502 |
| 5,656,991 | 8/1997 | Hargenrader et al. | 340/438 |
| 5,659,474 | 8/1997 | Maeno et al. | 701/45 |
| 5,666,065 | 9/1997 | Ravas et al. | 324/769 |

*Primary Examiner*—Josie Ballato
*Assistant Examiner*—Russell M. Kobert
*Attorney, Agent, or Firm*—Jimmy L. Funke

[57] ABSTRACT

The firing circuit of an inflatable restraint system is tested to verify operation of two FETs in series with a squib which are used to apply current to the squib. For the test the squib is biased to an intermediate voltage and each FET is turned on alone to apply battery or ground voltage to the squib. High and low voltage detectors sense the voltage excursion past respective thresholds to verify FET operation. A current detector for each FET senses a short when its FET is conducting, and a logic circuit immediately turns off the FET to result in a very brief FET on time. In addition, the voltage detectors may be used to detect shorts prior to FET testing and also to turn off or hold off the FETs when a high or low voltage is detected upon FET testing.

10 Claims, 5 Drawing Sheets

FAST ACTING FET TEST CIRCUIT WITH CURRENT DETECTION FOR SIR DIAGNOSTICS

FIELD OF THE INVENTION

This invention relates to supplemental inflatable restraint (SIR) systems for automotive vehicles and particularly to a method and an apparatus for rapidly testing FETs in a SIR firing circuit and detecting shorts of a firing circuit to ground or to its supply voltage.

BACKGROUND OF THE INVENTION

Supplemental inflatable restraint (SIR) systems for automotive vehicles generally employ a firing circuit having a squib for causing inflation of an air bag, a deployment circuit having an accelerometer sensitive to vehicle motion, especially deceleration, and a microprocessor monitoring the accelerometer output for evaluating the severity of a crash to determine whether to deploy the air bag. The vehicle battery or ignition system voltage empowers the deployment circuit and the firing circuit. The deployment circuit and the firing circuit are to a large extent carried out by a microprocessor on an integrated circuit chip, but an external harness leads to a squib at the site of each air bag.

It is conceivable that some portion of the harness might become damaged and short to ground or even to the vehicle battery voltage. To forestall the possibility that such inadvertent electrical connection to the firing circuit might cause deployment of the air bag or disable the system, it is desirable to monitor the system to detect any such event. It is already known to diagnose a short of the firing circuit by feeding a small test current through the squib and through a biasing resistor to ground. The resulting bias voltage will depend on the current and if there are no shorts to the firing circuit the resulting test voltage will be at a prescribed value. To assure this, the test current is carefully controlled. Where, for example, the current is provided by a current source on an integrated circuit, the circuit must be trimmed during manufacture to assure the correct current output. The test voltage is sampled by an A/D converter and fed to the microprocessor where it is monitored to detect a low value indicative of shorting to ground or a high value indicative of shorting to supply voltage.

The firing circuit includes a pair of FETs, one on each side of the squib. To deploy the air bag, the squib is fired by turning on both FETs. Thus to assure readiness to fire it is desirable to occasionally test the FETs (and their drive circuits) for operability. In prior systems the FETs were tested by commanding on a single FET at a time, and monitoring for the voltage on the deployment loop to go high (for a high side FET test) or low (for a low side FET test). This was accomplished by monitoring the low or high side of the deployment loop with an amplifier and then disabling the FET after a brief duration (several hundreds of microseconds). A microprocessor would be responsible for monitoring the low side of the squib, first checking to see that the squib was not shorted to battery or ground, and then commanding on the FET to be diagnosed. After a few hundred microseconds of delay, the amplifier would be checked, and the FET then disabled. With that arrangement it is conceivable that a short to ground (or battery) could occur immediately before or during testing the high side (or low side) FET. This has the possibility of causing an inadvertent deployment or degradation of the squib.

It has been proposed in U.S. patent application Ser. No. 08/651,073, filed May 22, 1996, now Pat. No. 5,666,065, entitled "FAST ACTING FET TEST CIRCUIT FOR SIR DIAGNOSTICS" by Ravas et al and assigned to an assignee of this application, to apply a bias voltage to a firing circuit, monitoring the firing circuit voltage to sense either a short or a FET turn-on, and then rapidly terminating FET conduction. The monitoring step comprises comparing the circuit voltage to upper and lower thresholds. While that circuit is very fast and efficient, it has a potential problem of not detecting a short to another circuit which applies a voltage within the range prescribed by the thresholds.

SUMMARY OF THE INVENTION

It is therefore an object of the invention to rapidly test FETs of a SIR firing circuit which is subject to a wide range of voltages due to shorts.

A SIR firing circuit has a squib serially connected through high and low side FETs between a power supply and ground. A bias voltage is applied to the squib and variations from that voltage are detected by high and low voltage detectors having thresholds set above and below the bias voltage. A detector is triggered if the squib is shorted to battery voltage or to ground, or if either FET conducts to apply high or ground voltage to the squib. The short causes an output signal even before a FET test signal is given. In the absence of a short, the voltage detector signals the successful test of a FET.

A test signal for either FET is applied to a FET test logic circuit to command turning on a selected one of the FETs. If a detector is already triggered due to a short, the command is not delivered to the FET gate driver. If there is no short, the selected FET is turned on, causing the squib voltage to quickly change and trigger a voltage detector which produces an output which is indicative of acceptable FET operability. A current detector in series with each FET detects any current above a threshold which is set to reveal currents due to a short. The output of the current detector is coupled to the logic circuit which then turns off the FET so that its current flows for only a brief period. The affected current detector then turns off but the logic circuit latches the signal to hold the FET off. Then the test signal for the other FET is issued. The detector outputs are monitored to determine that each FET operates when commanded, thereby verifying the operability of the FETs and their driving circuits, or diagnosing a fault.

Alternatively, the logic circuit is operated to turn off the FET under test when either the current detector is triggered or a voltage threshold has been breached.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE INVENTION

Figure 1:
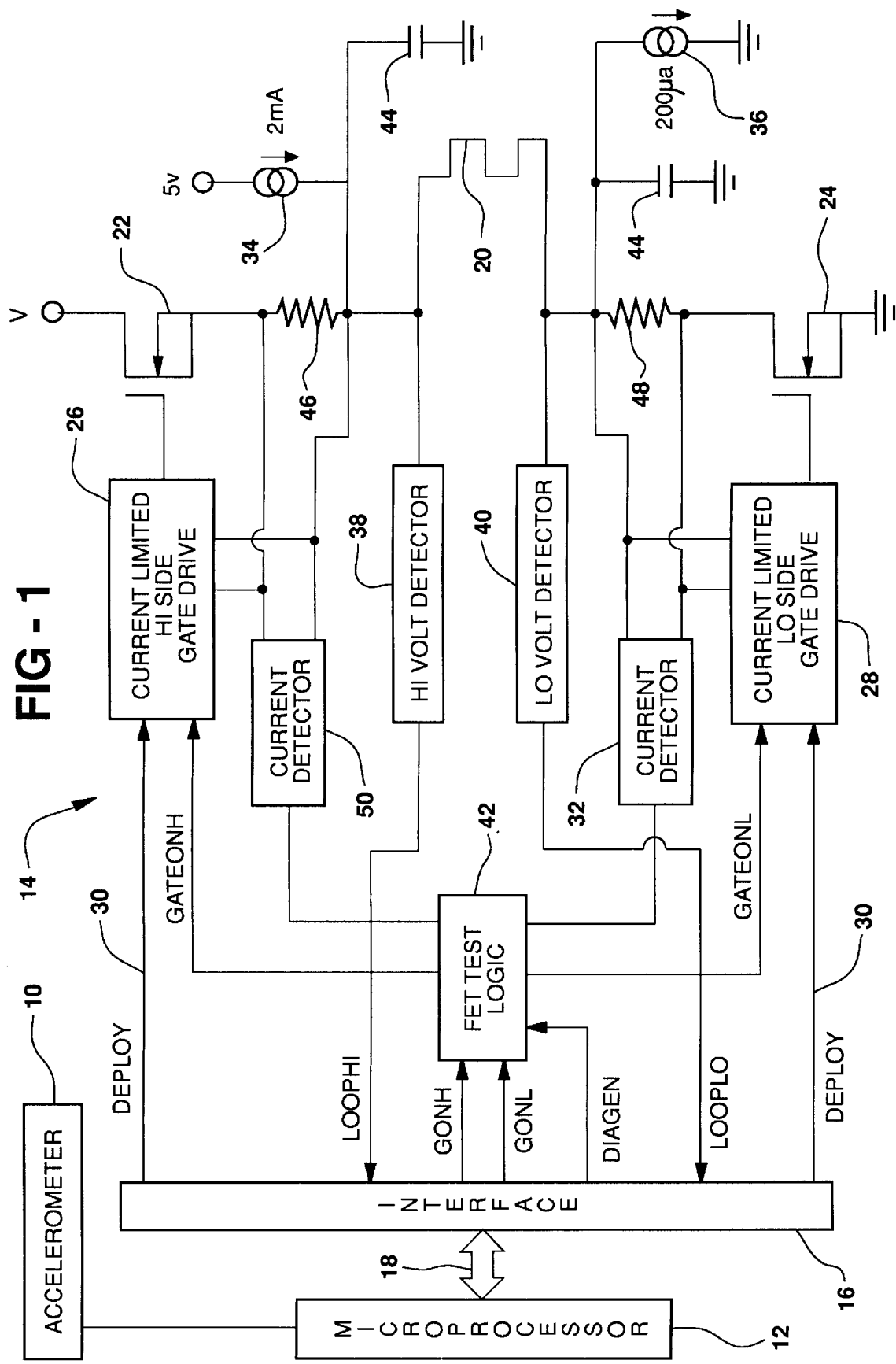
FIG. 1 is a block diagram of a SIR system including a FET test circuit according to the invention.

Referring to FIG. 1, a supplemental inflatable restraint (SIR) control for inflating an air bag (not shown) includes an accelerometer 10 which senses vehicle acceleration coupled to a microprocessor 12 which interprets acceleration data and decides when to deploy the air bags. This portion of the system is considered to be the deployment circuit. The firing circuit is incorporated in an application specific integrated circuit (ASIC) 14 having a serial interface 16 coupled by a data bus 18 to the microprocessor 12. An external squib 20 is connected by a wiring harness to the ASIC output. A high side FET 22 is serially connected between a reserve voltage V (which may be 25 v) and one side of the squib, and a low side FET 24 is serially connected between the other side of the squib and ground. The FETs 22 and 24 are driven by a high side gate drive 26 and a low side gate drive 28, which are current limited to 1.5 amps and 1.8 amps respectively. The gate drives are connected by lines 30 to the interface to carry deploy signals when issued by the microprocessor 12. Thus when the microprocessor issues a deploy command the interface will apply firing signals to the gate drives 26 and 28 via lines 30 to turn on the FETs 22 and 24 to fire the squib 20.

To assure that the FETs and the gate drives are operable and that there is no shorting to battery or ground of the harness connected to the squib, a test circuit monitors the circuit condition. Each time the vehicle ignition is turned on, the squib or loop voltage is monitored to detect a short, and then if there is no short the microprocessor issues test signals which cause the FETs to be turned on, one at a time, and the effect on the loop voltage is recorded.

A 2 ma current source 34 supplied by 5 volts is connected to the high side of the squib 20 and a 200 µa current sink 36 to ground is connected to the low side of the squib to establish a nominal 5 volts bias on the deployment loop. A high voltage detector 38 and a low voltage detector 40 are connected to the high and low sides of the squib, respectively. The detector outputs are connected to the interface and are relayed to the microprocessor. A FET test logic circuit 42 receives the detector outputs as well as a diagnostic enable (DIAGEN) signal, a high side gate turn-on command (GONH) and a low side gate turn-on (GONL) supplied by the microprocessor 12 through the interface 16. The test logic circuit has outputs to the two gate drivers 26 and 28 to turn on the FETs for testing. Small capacitors 44 are located at the nodes of the current source 34 and sink 36 and the squib 20.

In the event that a short occurs after the short tests are completed and before or during a FET test, the current of each FET is monitored to detect current which would occur only if there were a short. A high side current sensing resistor 46 in series with the FET 22 and a low side current sensing resistor 48 in series with the FET 24 are connected to current detectors 50 and 52 which provide inputs to the logic circuit 42. When a FET conducts with current exceeding a set threshold, the logic circuit 42 quickly terminates conduction of that FET, so that insufficient current is passed to deploy or even to degrade the squib.

Figure 2:
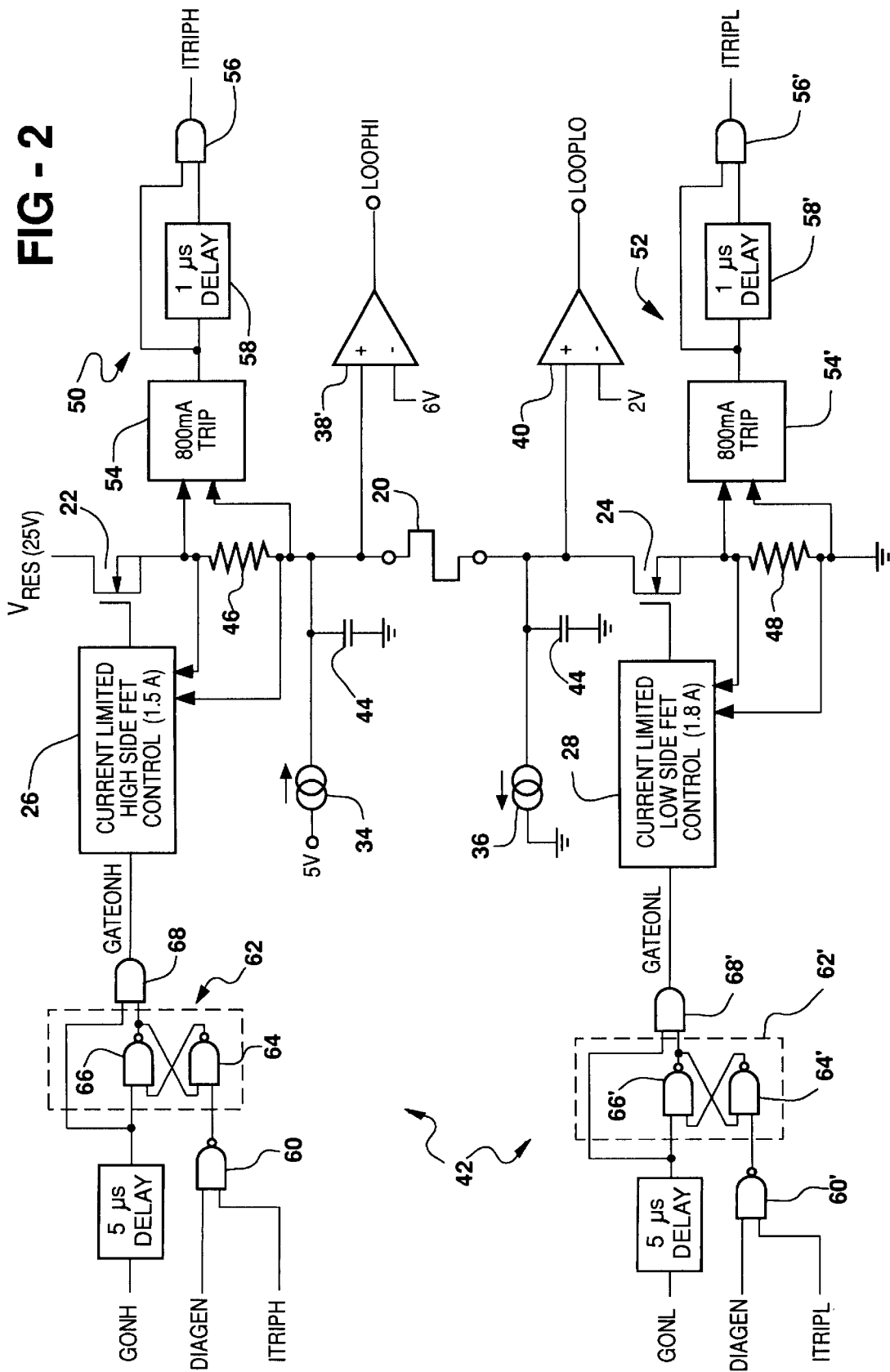
FIG. 2 is a schematic diagram of the test circuit of FIG. 1.

FIG. 2 shows the test logic circuit 42, the voltage detectors 38 and 40, the current sensing resistors 46 and 48 and current detectors 50 and 52, as well as the squib 20 and the current source 34 and sink 36. The high voltage detector 38 is a comparator referenced to a 6 volt threshold to produce a positive output (LOOPHI) when the loop voltage exceeds 6 volts. The low voltage detector 40 is a comparator referenced to a 2 volt threshold to produce a positive output (LOOPLO) when the loop voltage drops below 2 volts.

The current sensing resistors 46 and 48 are integrated with the other circuitry shown in FIG. 2 and are typically diffusion or poly resistors. Current sensing resistor 46 has a first terminal coupled to an electrode of FET 22 and a second terminal coupled to a first terminal of squib 20. Current sensing resistor 48 has a first terminal coupled to an electrode of FET 24 and a second terminal coupled to ground. In general, current sensing resistors have a low resistive value (less than one ohm) to minimize power dissipation and the series resistance through the path formed by FETs 22 and 24, and squib 20. In an embodiment of the circuit, sensing resistors have a resistance of approximately 34 milliohms.

The high side current detector 50 includes a current monitor 54, a delay circuit 58 and an AND gate 56. Current monitor 54 includes first and second inputs respectively coupled to the first and second terminals of current sensing resistor 46, and an output. Delay circuit 58 has an input coupled to the output to the output of current monitor 54 and an output. AND gate 56 has a first input coupled to the output of current monitor 54, a second input coupled to the output of delay circuit 58, and an output for providing a signal ITRIPH.

Current monitor 54 monitors current when FET 22 is enabled and provides an output signal indicating a short condition if a predetermined current is exceeded. The current sensed by current monitor 54 is substantially less than the predetermined current under normal test conditions. Current monitor 54 senses a voltage across current sensing resistor 46. The voltage corresponds to the current provided by FET 22. Current monitor 54 provides an output signal indicating a short condition when the voltage sensed exceeds a predetermined threshold. In an embodiment of the circuit, the predetermined threshold of current monitor 54 corresponds to a current of 800 mA.

Delay circuit 58 prevents the output of a false signal indicating a short condition during an initial portion of a test sequence due to a current spike produced in charging capacitor 44. Capacitor 44 provides a low impedance path to ground during an electrostatic discharge event and also suppresses radio frequency signals coupled to the circuit. As mentioned previously, when FET 22 is enabled a large current surge occurs which could exceed the predetermined threshold as current is provided to charge capacitor 44. AND gate 56 receives a real time signal from the output of current monitor 54 and a delayed signal from the output of the delay circuit 58. AND gate 56 does not output a one logic level (ITRIPH signal) unless both inputs are at a one logic level. The only way AND gate 56 can output a logic one level indicating a short condition is if the output of delay circuit 58 indicates a short condition for a time period greater than the delay of delay circuit 58. In an embodiment of the circuit, delay circuit 58 produces a delay longer than the current pulse produced by capacitor 44 under all operating conditions. For example, the initial current surge during a test sequence dissipates before 750 nanoseconds under worst case conditions. Delay circuit 58 is designed to provide a delay of one microsecond which is sufficient to insure a false signal is not produced by the AND gate 56 when FET 22 is first enabled.

When the gate output ITRIPH is at a logic one level it signifies that the FET 22 current is attributable to a short in the squib circuit which allows current flow from the source V through the FET 22. The ITRIPH signal is provided to the test logic circuit 42 for disabling FET 22 and indicating a short condition. Although not described in detail the low side current detector 52 operates equivalently to high side detector 50 and has equivalent components 54', 56' and 58' and produces an output ITRIPL indicative of a short which allows current flow through the FET 24.

The test logic circuit 42 has two identical sections, one for the high side and the other for the low side. The high side will be described and the corresponding low side elements are denoted by primed numerals in the drawing. The high side logic has a NAND gate 60 having as inputs the current detector 66 output ITRIPH and the diagnostic enable input DIAGEN. A latch 62 comprises NAND gate 64 and NAND gate 66 each having an output coupled to the input of the other, and NAND gate 64 has an input from the gate 60. The command GONH from the interface 16 is coupled to NAND gate 66 via a 5 μs delay circuit to enable the latch 62. The latch 62 output and the delayed GONH signal are two inputs of an AND gate 68 which is connected to the high side FET control 26. When the latch 62 is enabled by GONH and the input DIAGEN is present, the gate 68 output is the logical inverse of the signal ITRIPH, at least initially, to produce the signal GATEONH to activate the high side gate drive 26 and turn on FET 22. In the event a short is present which causes more than 800 mA current through the FET 22, the signal ITRIPH will go high, causing the gate drive 26 to turn off only a few microseconds after turning on. The signal ITRIPH will then go low, but the latch 62 will hold the AND gate 68 and the FET control 26 off. In the same way the low side logic circuit produces a signal GATEONL to activate the low side FET control 28.

In operation, the microprocessor samples the outputs LOOPHI and LOOPLO to determine the presence of shorts. If there is a short to battery or reserve voltage, the detector 38 will have a high output LOOPHI which results in LOOPHI being high. Similarly, a short to ground causes detector 40 to have a high output LOOPLO and the signal LOOPLO will be high. Thus if either output is high a short is present and a fault is indicated. In that case a FET test is largely irrelevant and the microprocessor will not initiate the FET test. If it is determined that there is no short, as is the usual case, the microprocessor issues the command DIAGEN to enable FET diagnostics and the command GONH to turn on the high side FET. That test is quickly completed and then DIAGEN and GONL are issued to test the low side FET.

For the high side test, for example, the command DIAGEN enables the input to the NAND gate 64 and the command GONH enables the NAND gate 66 so that the latch 62 is operative. The GONH command attempts to activate the NAND gate 66 after a short delay to assure that the latch will first operate. Then the FET control 26 will turn on the FET 22. Normally there will be no current flow except an initial surge to charge the capacitors 44. However, if a short to ground is present, FET current will flow in excess of the 800 mA threshold to trip the monitor 54 and activate the gate 56 to produce the ITRIPH signal. That signal will quickly turn off the NAND gate 66 and thus the FET, thereby avoiding deployment or squib degradation. Thus the FET will be on for only a few microseconds instead of hundreds of microseconds as in previous tests. The latch will hold the low output until the GONH command is removed. The low side logic works in the same manner. In the absence of a prior short indication, the high values of LOOPHI and LOOPLO are then interpreted by the microprocessor as verification of the FET operation. However, if a short occurs during the FET test, it is extremely unlikely that it would first occur in the very short period of FET conduction. Even if a short did occur during this short period, deployment or squib degradation will not occur for such a brief current flow.

Figure 3:
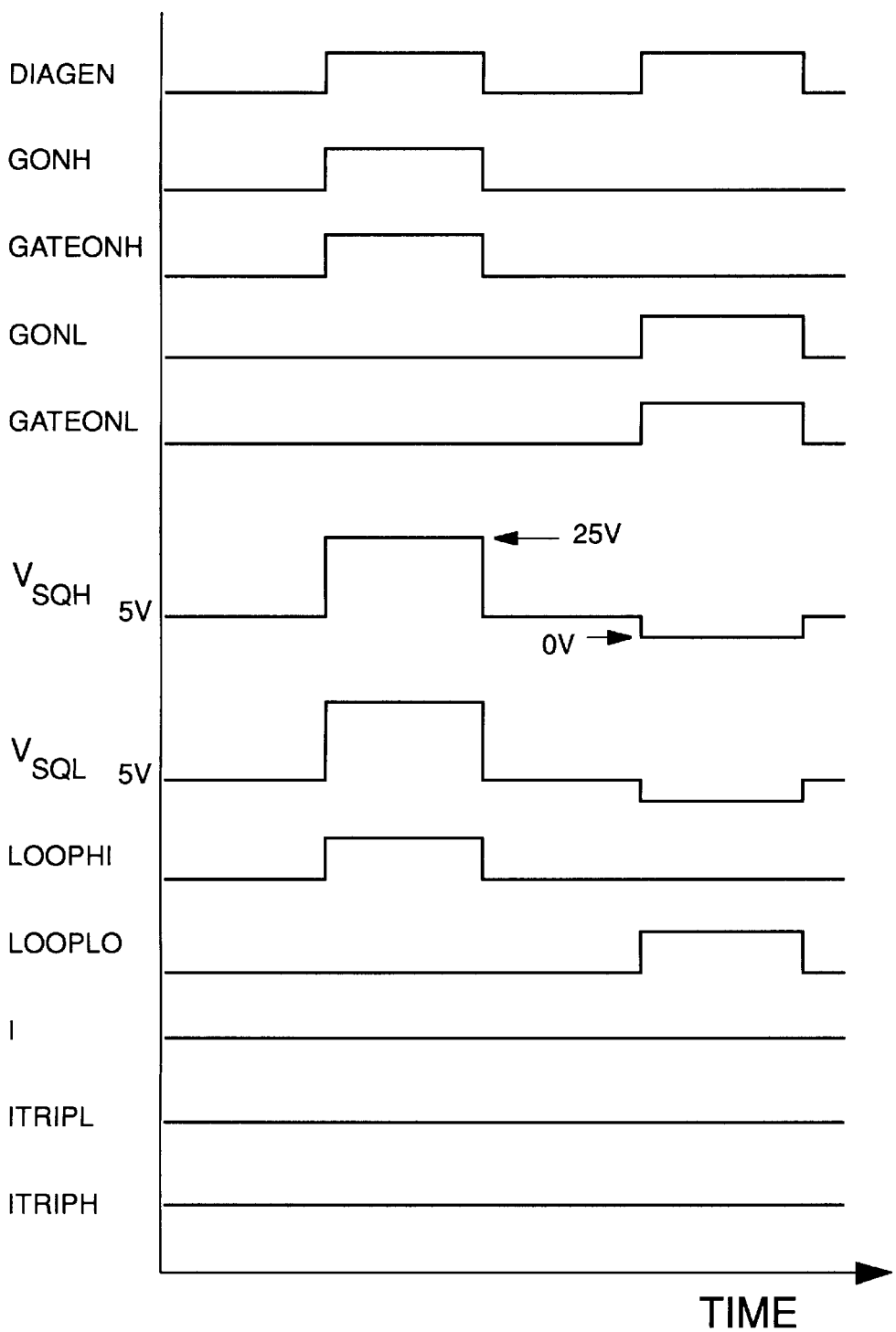
FIG. 3 is a set of waveforms illustrating the operation of the test circuit for a normal firing circuit.

FIG. 3 illustrates the circuit operation by showing the states of the various signals. In FIG. 3 (and FIG. 4) the voltage signal levels are either 0 or 5 v, except for VSQH and VSQL where the base line is at 5 v. When vehicle ignition is turned on the microprocessor 12 first tests for shorts by sampling the states of LOOPHI and LOOPLO. Then, as shown in FIG. 3, if there are no shorts, the signal DIAGEN goes high for two test periods. GONH is commanded to be high during one DIAGEN period and GONL is high in the other period. When GONH is asserted GATEONH goes high to turn on the high side FET and the high side squib voltage VSQH rises above 6 volts to trigger the detector 38, turning on LOOPHI. The FET and the output LOOPHI are held on for the duration of GONH. VSQH and VSQL are raised to the reserve voltage, 25 v because the high side FET is conducting. Similar action occurs during the period when GONL is high. Then GATEONL and the output LOOPLO will be high for the duration of GONL. VSQH and VSQL go to 0 v because the low side FET is conducting. Significant current I does not occur during normal operation and neither ITRIPH nor ITRIPL are produced.

Figure 4:
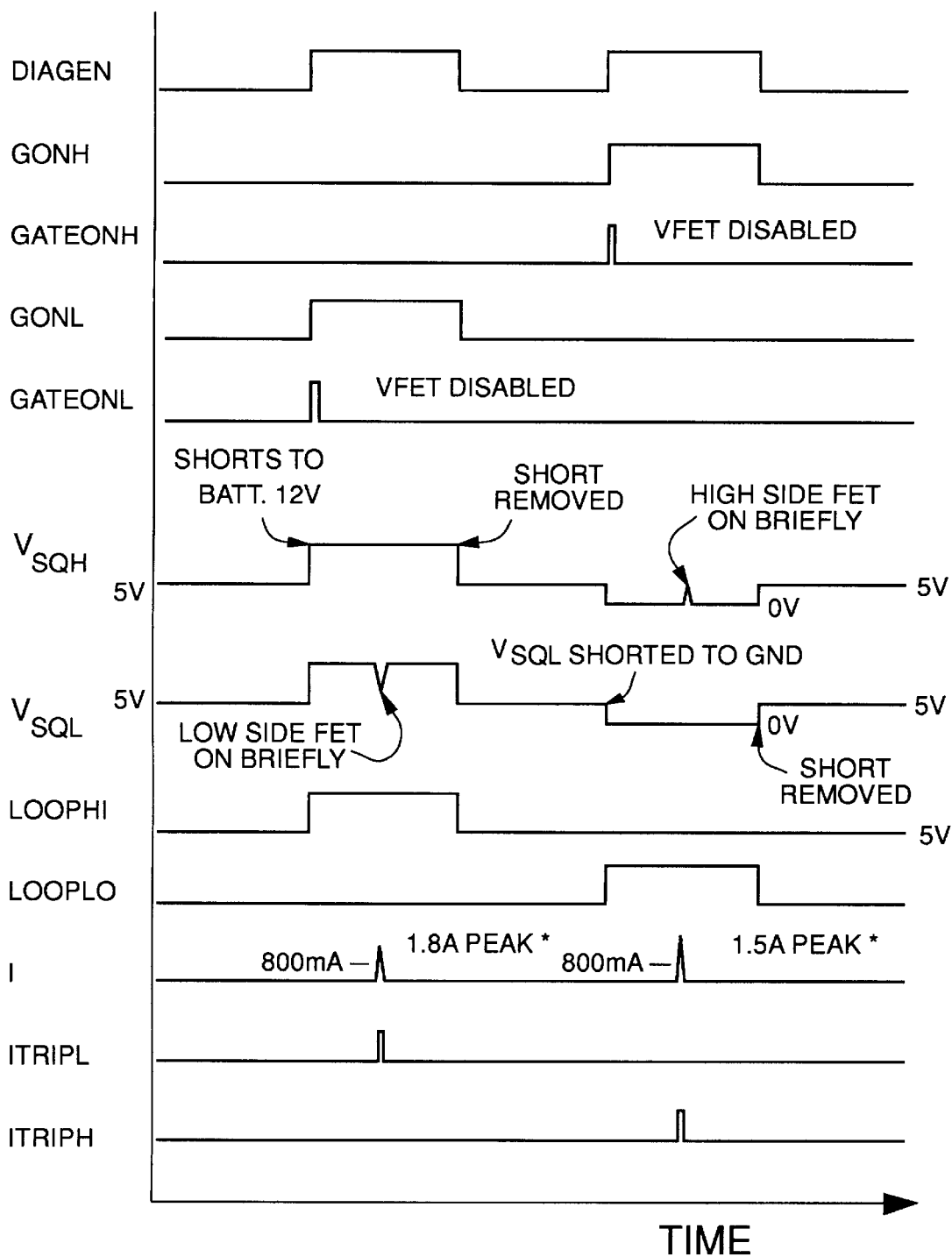
FIG. 4 is a set of waveforms illustrating the operation of the test circuit for a firing circuit having shorts to ground or battery.

FIG. 4 shows the effects of a short to ground or to battery when the test signals are applied. This would occur only if a short occurs after the microprocessor tests LOOPHI and LOOPLO for shorts. VSQH shows a 12 volt level for a first period resulting from a short to battery. This is detected by detector 38 and LOOPHI goes high for the entire period. When DIAGEN and GONL are asserted the FET 24 begins to conduct as shown by GATEONL and the current I which results in ITRIPL going high briefly to cause immediate FET turn-off. The short current briefly affects VSQL. In the same way, VSQL shows a short to ground for a second period causing LOOPLO to go high and the FET 22 conducts only briefly and is turned off when ITRIPH is generated. In each case the FET current may exceed the 800 mA threshold due to propagation and turn-off delays, but is limited by the FET controls 26 and 28.

Thus when a short occurs before the FET test, the FET is not enabled. Even if a short were initiated when the FET is on or just coming on, the few microseconds of FET conduction is not sufficient to cause squib degradation or deployment. It will be understood that in practice the shorts will not occur in discrete periods but are likely to extend throughout the test period.

Figure 5:
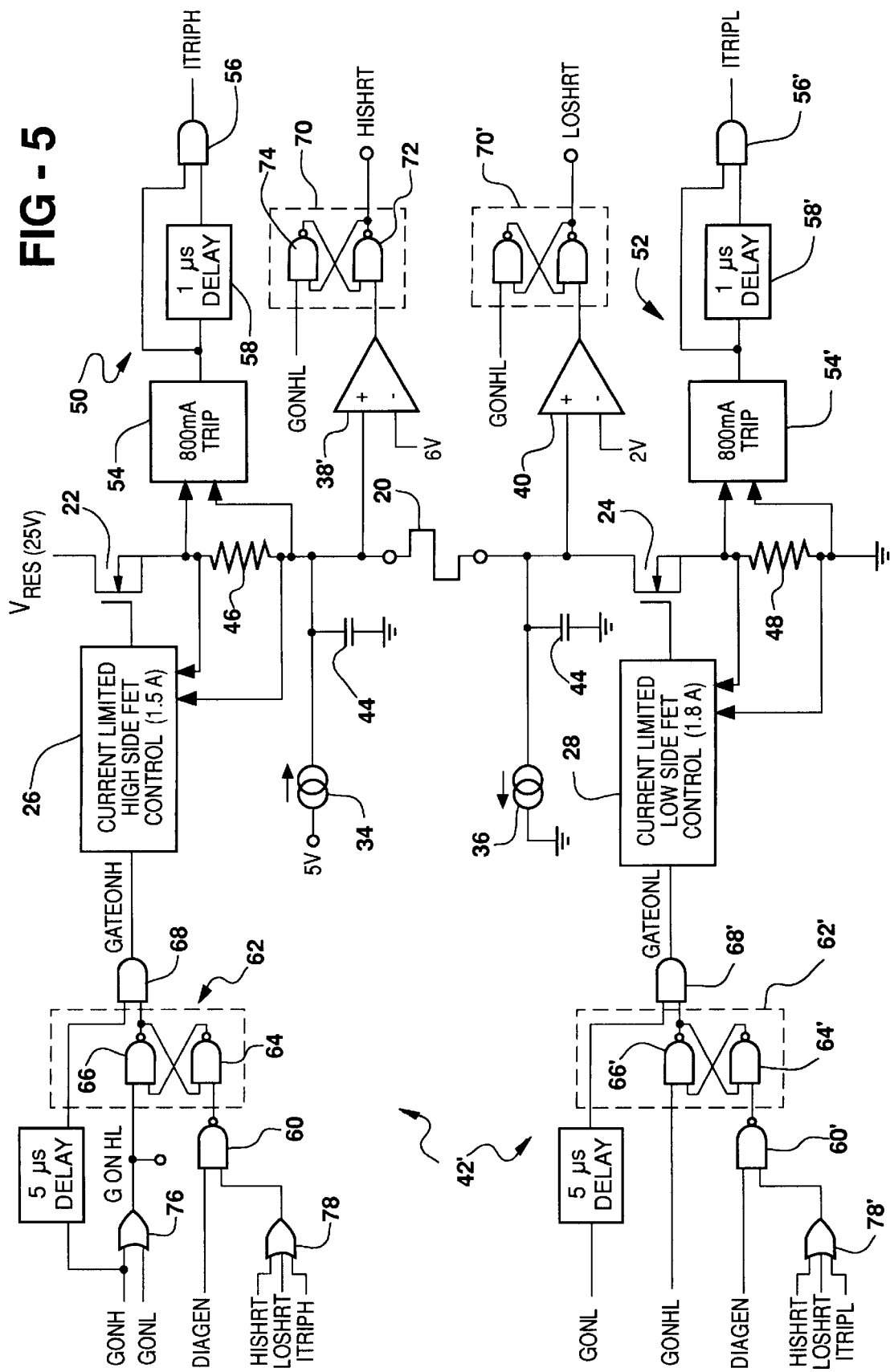
FIG. 5 is a schematic diagram of a test circuit according to another embodiment of the invention.

To protect against resistive shorts which may not allow enough current to flow to trip the monitor 54, the current monitoring may be combined with voltage detection. Such a combined circuit is depicted in FIG. 5. The circuit comprising elements 20 through 58 is the same as in FIG. 2 except for changes in the detectors 38 and 40 and the logic 42 as shown by 38', 40' and 42'. The detector polarities are reversed on the voltage detectors 38' and 40' so that for example the detector 38' output is low when the loop voltage exceeds 6 volts. The detector 38' output is connected to an input of a latch circuit 70 which has an output HISHRT indicative of a short imposing battery voltage or other voltage above 6 volts on the loop. The latch 70 comprises NAND gates 72 and 74, each providing an input to the other. A signal GONHL which is a combination of GONH and GONL is input to the gate 74 to enable the latch 70. Detector 38' output is coupled to the gate 72 and the gate 72 output is the signal HISHRT. When GONL is low HISHRT will be the inverse of the detector output. When GONHL is high, a low or normal loop voltage will produce a low HISHRT signal but a high loop voltage will cause HISHRT to be latched high as long as GONHL is applied. Similarly the latch 70' will yield a signal LOSHRT when the loop voltage goes below 2 volts.

The logic circuit 42' includes an OR gate 76 with inputs GONH and GONL to produce GONHL. GONHL is the enabling signal of latch 62 and GONH passes through a 5 μs delay to an input of the AND gate 68. The signals HISHRT, LOSHRT and ITRIPH are inputs of an OR gate 78. The NAND gate 60 has inputs from DIAGEN and the OR gate 78 output. The low side logic has the same configuration with signals GONL and ITRIPL as inputs.

In operation, the HISHRT and LOSHRT are the output signals provided to the system microprocessor so that a low or high loop voltage indicative of a short will cause one of those signals to go high. When a FET test is enabled by turning on signals DIAGEN and GONH, for example, the FET 22 will be turned on and if there is no short the loop voltage and HISHRT will both go high. Since HISHRT is applied to the latch 62 via OR gate 78 the FET control 26 will be turned off so that the FET exercise is of very short duration. The HISHRT output to the microprocessor verifies the FET operation. If there is a short sufficient to activate either detector 38' or 40', either HISHRT or LOSHRT will go high and the logic circuit 42' will prevent either FET being turned on. However, during a test of FET 22, if a short occurs at a moderate voltage and neither detector 38' nor 40' is triggered, the current flow through resistor 46 will trip the monitor 54 so that ITRIPH will activate the latch to immediately turn off the FET. Of course a similar operation occurs for test of the low side FET 24.

It will thus be seen that the FETs of a SIR firing loop can be tested without any danger of firing the squib even when a short occurs to allow FET current to flow. By detecting the current and immediately turning off the FET under test the current applied to the squib will be insufficient to degrade or deploy the squib. Even in the case of a resistive short the short can be detected by sensing abnormal loop voltage and turning off the FET.

The embodiments of the invention in which an exclusive property or privilege is claimed are defined as follows:

1. An automotive supplemental inflatable restraint system having a firing circuit including a squib between two FETs serially coupled between a voltage source and ground for effecting inflation of a restraint, and a microprocessor based deployment controller for controlling the firing circuit, the improvement comprising:

a gate drive circuit responsive to a test signal from the deployment controller for turning on a selected FET to test operability of such FET;

a current detector circuit for detecting firing circuit current above a current threshold indicative of a short condition; and the gate drive circuit including a logic circuit responsive to the detection of a short condition by said current detector circuit for turning off the selected FET independent of said deployment controller so that the selected FET is immediately disabled independent of said deployment controller during a short condition.

2. The improvement as defined in claim 1 wherein the logic circuit includes:

a control gate coupled to said selected FET; and a latch circuit responsive to the current detector circuit for disabling the control gate when firing circuit current above the threshold is detected.

3. The improvement as defined in claim 1 wherein the gate drive circuit includes:

a gate responsive to a diagnostic enabling signal from the deployment controller for enabling the gate drive circuit only during the diagnostic enabling signal.

4. The improvement as defined in claim 1 including:

a voltage detector circuit coupled to the firing circuit for detecting variance of a voltage on the squib beyond set voltage thresholds above and below a regulated voltage applied to the squib, the logic circuit being additionally responsive to the voltage detector circuit for disabling the selected FET when the voltage breaches one of the voltage thresholds.

5. An automotive supplemental inflatable restraint system having a firing circuit including a squib between first and second transistors serially coupled between a voltage source and ground, respectively, for effecting inflation of a restraint, and a microprocessor based deployment controller for controlling the firing circuit, the improvement comprising:

a first resistor coupled between said first transistor and said squib;

a first voltage detector circuit responsive to a voltage at a first terminal between said first resistor and said squib;

a first current detector circuit responsive to a voltage across said first resistor; and a first control logic circuit responsive to said first voltage detector circuit and said first current detector circuit for immediately disabling said first transistor independent of said deployment controller when a short condition is detected during a diagnostic sequence initiated by the deployment controller.

6. The improvement of claim 5 further including:

a second resistor coupled between said second transistor and said squib;

a second voltage detector circuit responsive to a voltage at a second terminal between said second resistor and said squib;

a second current detector circuit responsive to a voltage across said second resistor; and a second control logic circuit responsive to said second voltage detector circuit and said second current detector circuit for immediately disabling said second transistor independent of said deployment controller when a short condition is detected during said diagnostic sequence.

7. The improvement of claim 6 wherein said second voltage detector circuit comprises:

a comparator for comparing said voltage at said second terminal against a second reference voltage; and a latch responsive to said comparator for providing a signal corresponding to said short condition.

8. The improvement of claim 6 wherein said second current detector circuit comprises:

a current monitor circuit responsive to a voltage across said second resistor:

a delay circuit responsive to said current monitor circuit; and an AND gate responsive to said current monitor circuit and said delay circuit for providing a signal corresponding to said short condition when a predetermined current is exceeded for a time period greater than a delay of said delay circuit.

9. The improvement of claim 5 wherein said first voltage detector circuit comprises:
- a comparator for comparing said voltage at said first terminal against a first reference voltage; and
- a latch responsive to said comparator for providing a signal corresponding to said short condition.

10. The improvement of claim 8 wherein said first current detector circuit comprises:
- a current monitor circuit responsive to a voltage across said first resistor;
- a delay circuit responsive to said current monitor circuit; and
- an AND gate responsive to said current monitor circuit and said delay circuit for providing a signal corresponding to said short condition when a predetermined current is exceeded for a time period greater than a delay of said delay circuit.

* * * * *